United States Patent
Hazan et al.

(10) Patent No.: US 9,298,863 B2
(45) Date of Patent: Mar. 29, 2016

(54) METHOD AND APPARATUS FOR SAVING ENERGY AND REDUCING CYCLE TIME BY USING OPTIMAL ROBOTIC JOINT CONFIGURATIONS

(71) Applicant: Siemens Industry Software Ltd., Airport (IL)

(72) Inventors: Moshe Hazan, Elad (IL); Lisandro Embon, Petah Tikva (IL); Rahav Madvil, Rishon Lezion (IL)

(73) Assignee: Siemens Industry Software Ltd., Airport City (IL)

( * ) Notice: Subject to any disclaimer, the term of this patent is extended or adjusted under 35 U.S.C. 154(b) by 0 days.

(21) Appl. No.: 14/448,416

(22) Filed: Jul. 31, 2014

(65) Prior Publication Data

US 2016/0034613 A1 Feb. 4, 2016

(51) Int. Cl.
*B25J 17/00* (2006.01)
*G06F 17/50* (2006.01)

(52) U.S. Cl.
CPC .................................. *G06F 17/5009* (2013.01)

(58) Field of Classification Search
CPC ............ A61B 2019/2234; B25J 13/088; B25J 9/1682; B25J 9/1643; G05B 2219/39135; Y10T 74/20329
USPC ............. 700/245, 257, 261; 318/568.21, 560, 318/567, 568.11, 568.13; 74/490.05
See application file for complete search history.

(56) References Cited

U.S. PATENT DOCUMENTS 6,004,016 A * 12/1999 Spector .......................... 700/56
6,216,058 B1 4/2001 Hosek et al.
6,493,607 B1 12/2002 Bourne et al.
8,401,698 B2 * 3/2013 Kamrani et al. .............. 700/245
2006/0025890 A1 2/2006 Nagatsuka et al.
(Continued)

FOREIGN PATENT DOCUMENTS

DE 102008027475 A1 12/2009
DE 102010052253 A1 5/2012
(Continued)

OTHER PUBLICATIONS

Ahuactzin, J., et al., "Using Genetic Algorithms for Robot Motion Planning," Proceedings of the 10th European Conference on Artifical Intelligence, 1992, 5 pages.
(Continued)

*Primary Examiner* — Dalena Tran

(57) ABSTRACT

Methods for saving energy and reducing cycle time of a complex operation by using optimal robotic joint configurations. A method includes receiving inputs including the complex operation, generating a plurality of joint configurations of a simulated robot for each one of a plurality of task locations based on the inputs of the complex operation, calculating an edge rating for each of a plurality of robotic movements, wherein a robotic movement accounts for movement between joint configurations of consecutive task locations, calculating a plurality of candidate ratings for each of a plurality of candidate configuration paths, wherein a candidate rating is a summation of edge ratings of robotic movements for a candidate configuration path, determining an optimal configuration path based the candidate configuration path with an optimal rating, wherein the optimal rating is determined by the lowest candidate rating, and return the optimal configuration path.

20 Claims, 6 Drawing Sheets

(56) References Cited

U.S. PATENT DOCUMENTS

| | | |
|---|---|---|
| 2008/0009971 A1 | 1/2008 | Kim et al. |
| 2008/0306628 A1 | 12/2008 | Ng-Thow-Hing et al. |
| 2009/0105880 A1 | 4/2009 | Okazaki |
| 2010/0305751 A1 | 12/2010 | Nagatsuka |
| 2011/0153080 A1 | 6/2011 | Shapiro et al. |
| 2012/0158174 A1 | 6/2012 | Moon et al. |
| 2012/0165982 A1 | 6/2012 | Kim et al. |
| 2012/0290131 A1 | 11/2012 | Khoukhi |
| 2013/0030569 A1 | 1/2013 | Fudaba et al. |
| 2014/0005804 A1 | 1/2014 | Brand |

FOREIGN PATENT DOCUMENTS

| | | |
|---|---|---|
| EP | 1090723 A2 | 4/2001 |
| EP | 2157490 A1 | 2/2010 |
| EP | 2485875 B1 | 4/2013 |
| JP | 2004243461 A | 9/2004 |
| JP | 2006192554 A | 7/2006 |
| WO | 2005049284 A1 | 6/2005 |
| WO | 2011042293 A1 | 4/2011 |
| WO | 2014/052286 A1 | 4/2014 |

OTHER PUBLICATIONS

Bohlin, R., et al., "Path Planning Using Lazy PRM," Proceedings of the 2000 IEEE International Conference on Robotics and Automation, San Francisco, CA, USA Apr. 2000, pp. 521-528.

Chen, P., et al. "SANDROS: A Motion Planner with Performance Proportional to Task Difficulty," Proceedings of the 1992 IEEE International Conference on Robotics and Automation, Nice, France, May 1992, 8 pages.

Faverjon, B., et al., "The mixed Approach for Motion Planning: Learning Global Strategies from a Local Planner," Proceedings of the International Joint Conference on Artifical Intelligence, Jan. 1, 1987, 7 pages.

Gueta, L., et al., "Compact Design of Work Cell with Robot Arm and Positioning Table Under a Task Completion Time Constraint," 2009 IEEE/RSJ International Conference on Intelligent Robots and Systems, St. Louis, MS, USA, Oct. 11-15, 2009, 7 pages.

Gueta, L., et al., "Practical Point-to-Point Multiple-Goal Task Realization in a Robot Arm with a Rotating Table," Advanced Robotics, vol. 25, No. 6-7, 2011, pp. 717-738.

Hein, B., et al., Automated Generated Collision-Free Time Optimized Robot Movements in Industrial Environments Based on Rounding, Proceedings of the 4th IEEE International Symposium on Assembly and Task Planning, Furuoka, Japan, May 28-29, 2001, pp. 110-115.

Hirakawa, A., "Trajectory Generation for Redundant Manipulators Under Optimization of Consumed Electrical Energy," Conference Record of the 1996 IEEE Industry Applications Conference—31st IAS Annual Meeting, IEEE Service Center, US, vol. 6, Oct. 6, 1996, XP010201236.

Hwang, Y., et al., "Optimizing Robot Placement for Visit-Point Tasks" Proceedings of the AI and Manufacturing Research Planning Workshop, Albuquerque, NM, USA, Jun. 1996, 7 pages.

Sanchez, G., et al, "Locally-Optimal Path Planning by Using Probablistic Roadmaps and Simulated Annealing," Proceedings of IASTED International Conference on Robotics and Applicatiions, Oct. 1999, 6 pages.

Skiena, S., "Weighted Graph Algorithm," The Algorithm Design Manual, 2nd Ed., Chapter 6, London, England, Aug. 2008, 39 pages.

Tian, L., et al., "An Effective Robot Trajectory Planning Method Using a Genetic Algorithm," Mechatronics, vol. 14, 2004, pp. 455-470.

Yue, S., et al., "Point-to-Point Trajectory Planning of Flexible Redundant Robot Manipulators Using Genetic Algorithms," to appeal in Robotica, Trajectory Planning of FRM, Jul. 17, 2001, pp. 1-24.

Foreign Communication From a Related Counterpart Application, PCT Application No. PCT/US2013/061340, International Search Report dated Jan. 31, 2014, 6 pages.

Foreign Communication From a Related Counterpart Application, PCT Application No. PCT/US2014/021801, International Search Report dated Sep. 3, 2014, 5 pages.

Bernhardt, R., et al. "The Virtual Robot Controller (VRC) Interface." ISATA 2000, Automation & Transportation Technology Simulation and Virtual Reality. Dublin, Ireland, Sep. 25-27, 2000, 6 pages.

Bernhardt, R., et al. "Realistic Robot Simulation in Concurrent Engineering of Manufacturing Lines in Automotive Industries." Eighth ISPE Int'l Conference on Concurrent Engineering: Research and Applications, Jul. 29-Aug. 1, 2002, 5 pages.

Bernhardt, R., et al. "Virtual Robot Controller (VRC) Interface." Robotik. (2000) (7 pages). (No English translation available).

Willnow, C., et al. "Virtual Time Management of Virtual Robot Controllers." Modelling and Simulation 2001, 15th European Simulation Multiconference 2001, ESM' 2001, Jun. 6-9, 2001, Prague, Czech Republic, 8 pages.

Bernhardt, R., et al. "Virtual Robot Controllers as Simulation Agents." 2nd Workshop on Agent-Based Simulation. ISBN 1-56555-215-6. Apr. 2-4, 2001, Passau, Germany, 6 pages.

Bernhardt, R., et al. "Development of Virtual Robot Controllers and Future Trends." 6th IFAC Symposium on "Cost oriented Automation." Berlin, Germany, Oct. 8-9, 2001, 7 pages.

Bernhardt, R., et al. "Von realistischer roboter simulation zu virtuellen steuerungen." ZWF, Zeitschrift fur wirtschaftlichen Fabrikbetrieb, 2000, Munich, 5 pages. (No English translation available).

"Realistic Robot Simulation (RRS)." www.realistic-robot-simulation.org, Fraunhofer IPK. (2009) Retrieved Jul. 26, 2014, 4 pages.

Foreign Communication From a Related Counterpart Application, European Application No. 15160330.5, European Search Report dated Jul. 22, 2015, 8 pages.

U.S. Appl. No. 14/197,620, Final Office Action dated Jul. 31, 2015, 16 pages.

EP Search Report dated Dec. 18, 2015, for EP Application 15175976.8, 9 pages.

Gasparetto, Alessandro et al. "Trajectory Planning in Robotics," Mathematics in Computer Science, vol. 6, No. 3, Aug. 30, 2012 pp. 269-279, XP035125437, 11 pages.

* cited by examiner

400

440

METHOD AND APPARATUS FOR SAVING ENERGY AND REDUCING CYCLE TIME BY USING OPTIMAL ROBOTIC JOINT CONFIGURATIONS

CROSS-REFERENCE TO OTHER APPLICATION

This application shares some subject matter with commonly-assigned U.S. patent application Ser. No. 14/447,964 for "Method and Apparatus for Saving Energy and Reducing Cycle Time by Optimal Ordering of the Industrial Robotic Path", which is hereby incorporated by reference.

This application shares some subject matter with commonly-assigned U.S. patent application Ser. No. 14/340,365 for "Energy and Cycle Time Efficiency Based Method for Robot Positioning" which is hereby incorporated by reference.

TECHNICAL FIELD

The present disclosure is directed, in general, to automated industrial operations and robotics, and in particular to methods and systems for global optimization of robotic joints configurations of a given path.

BACKGROUND OF THE DISCLOSURE

Product data management (PDM) systems manage product lifecycle management (PLM) systems and other data. Improved systems are desirable.

SUMMARY OF THE DISCLOSURE

Various disclosed embodiments include a method for saving energy and reduce cycle time by using optimal robotic joint configurations. The method includes receiving inputs including the complex operation, generating a plurality of joint configurations of a simulated robot for each one of a plurality of task locations based on the inputs of the complex operation, calculating an edge rating for each of a plurality of robotic movements, wherein a robotic movement accounts for movement between joint configurations of consecutive task locations, calculating a plurality of candidate ratings for each of a plurality of candidate configuration paths, wherein a candidate rating is a summation of edge ratings of robotic movements for a candidate configuration path, determining an optimal configuration path based the candidate configuration path with an optimal rating, wherein the optimal rating is determined by the lowest candidate rating, and return the optimal configuration path.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Determining the most efficient joint configuration path for a complex process requires consideration of numerous constraints including whether the robot can reach all task locations from a given robot position, whether any collisions occur with the robot and any objects within its environment, and calculating the total amount of energy required to perform the complex task, along with other considerations.

Robots can be heavy power consumers. Robots work repeatedly on one or more tasks for long hours and have complex powertrains that can include engines, transmissions, and so on. In a typical production line, there can be many robots, which further amplify these issues.

Applying this approach on every robot in a production line reduces the energy consumption and total cycle time resulting in reduced production costs. The reduced production costs come from finding optimal configuration path for each robot in the production line to reduce overall energy consumption and total cycle time.

Figure 1:
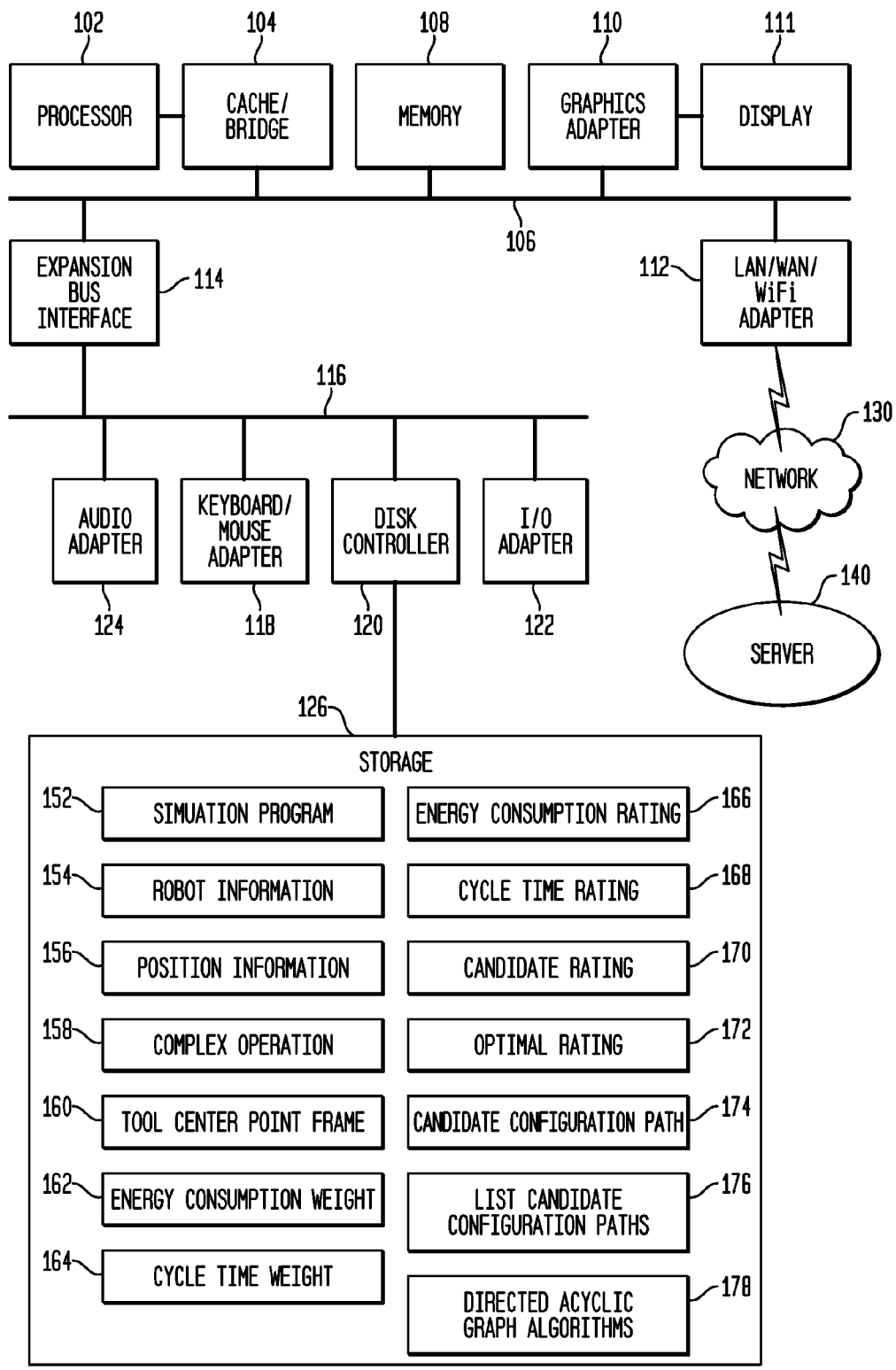
FIG. 1 illustrates a block diagram of a data processing system in which an embodiment can be implemented.

FIG. 1 illustrates a block diagram of a data processing system in which an embodiment can be implemented, for example as a PDM system particularly configured by software or otherwise to perform the processes as described herein, and in particular as each one of a plurality of interconnected and communicating systems as described herein. The data processing system illustrated includes a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices. The storage 126 stores the simulation program 152, the robot information 154, the position information 156, the complex operation 158, the tool center point frame (TCPF) 160, the energy consumption weight 162, the cycle time weight 164, the energy consumption rating 166, the cycle time rating 168, the candidate rating 170, the optimal rating 172, the candidate configuration path 174, the list of candidate configuration paths 176 and so on, which are described below.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
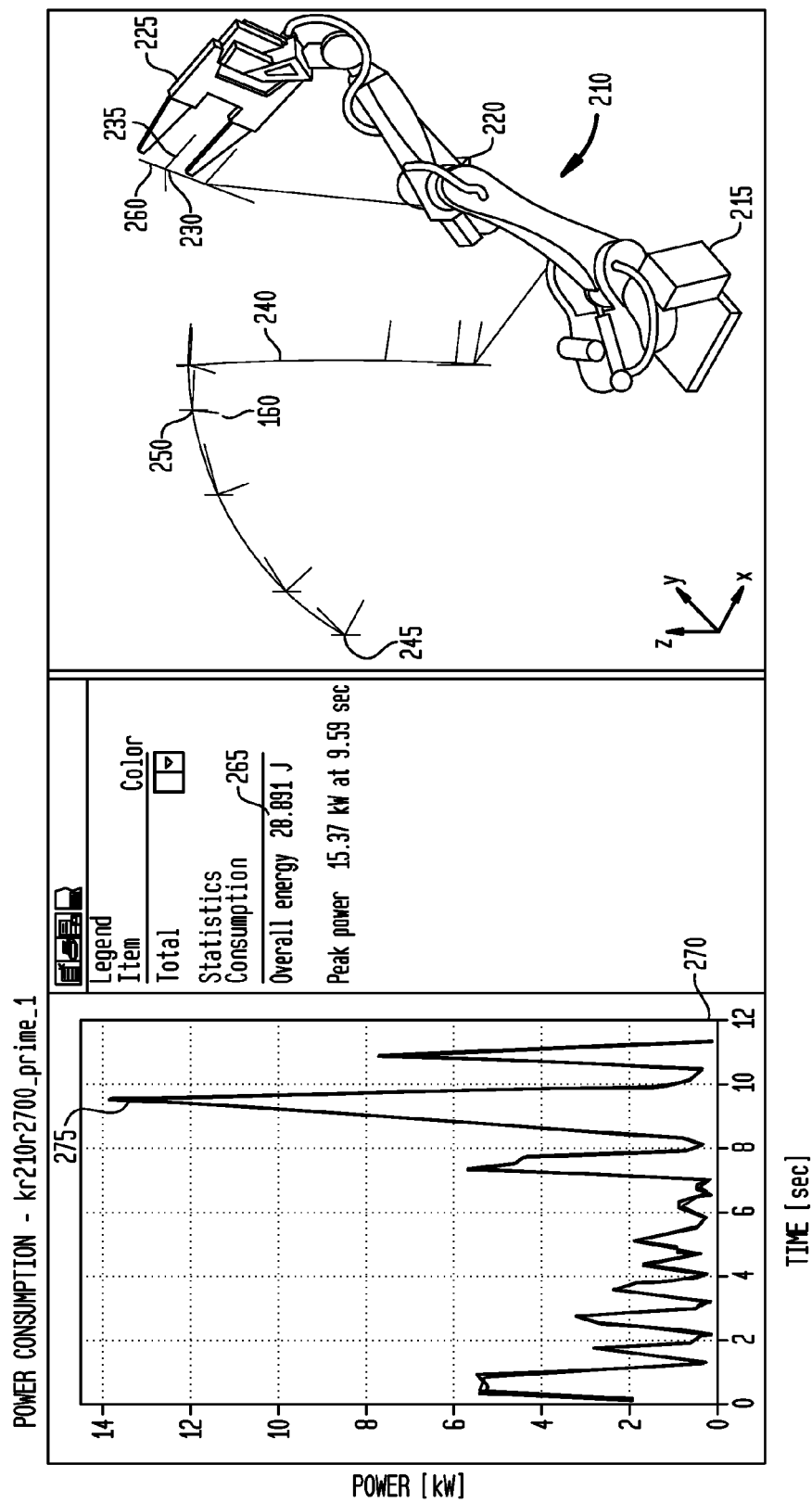
FIG. 2 illustrates a complex operation path for a simulated robot in a three dimensional (3D) complex operation field of a robot simulation in which an embodiment can be implemented.

FIG. 2 illustrates a complex operation path 240 for a simulated robot 210 in a three dimensional (3D) complex operation field of a robot simulation 200 in which an embodiment can be implemented.

The simulated robot 210 represents a simulated model of the robot that allows for simulation of the movements of the robot. The simulated robot 210 is stored in the robot information 154 and is comprised of a base 215, a plurality of joints 220, and an end of arm (EOA) 225. The simulated robot 210 is fixed and positioned in the 3D complex operation field.

The arm of the robot includes a plurality of joints 220 and connects the EOA 225 to the base 215. The simulated robot 210 moves and orients the EOA 225 by rotating at multiple joints 220. In this embodiment, the simulated robot 210 rotates around six joints 220, but the simulated robot 210 can contain any amount of joints 220. The joints 220 used for the simulated robot 210 can any suitable type of joint 220, including but not limited to knuckle joints, turnbuckle joints, pin joints or ball joints.

The EOA 225 is the end of the simulated robot 210 opposite of the base 215. The EOA 225 is an attachment or tooling required for the simulated robot 210 to complete the tasks of the complex operation 158, such as a welder, soldering iron, clamp, or any other suitable attachment or tooling. The EOA 225 includes a simulated robot contact point (SRCP) 230 and a simulated robot point frame (SRPF) 235. The SRCP 230 defines the point at the end of the EOA 225 which a task is performed. The SRPF 235 defines the orientation of the EOA 225 for the completion of tasks in the simulation.

The complex operation 158 is comprised of a series of tasks in which the robot is used to complete. In the robot simulation 200, the complex operation 158 is represented by an initial location 245, a plurality of task locations 250, a final location 260, and a complex operation path 240 connecting all of the locations. The task locations 250 representing the tasks are defined in the complex operation 158.

The complex operation path 240 is defined by the order in which the tasks are to be performed. The complex operation path 240 begins at the initial location 245, continues to a plurality of task locations 250, and ends at the final location 260. The complex operation path 240 represents the optimal path based on distance the EOA 225 follows as the simulated robot 210 moves from one task location 250 to the next. Because the joints 220 on the simulated robot 210 are different sizes and types, the path of the EOA 225 does not necessarily move along the illustrated path.

In certain embodiments, the complex operation 158 requires the EOA 225 to move along the complex operation path 240 starting at the initial location 245 and ending at the final location 260. The initial location 245 and final location 260 are illustrated as different locations, but they could also be the same location. The initial location 245 and final location 260 might also be a task location 250 or could just be a location not interfering with the insertion or removal of the product. In this embodiment, the final location 260 is a dummy location. A dummy location is irrelevant to the complex operation 158, but needed for using a directed acyclic graph (DAG) algorithm 178.

The complex operation 158 requires a plurality of task to be performed. Each task in the complex operation 158 is represented in the robot simulation 200 by a task location 250 and a tool center point frame (TCPF) 160. The plurality of task locations 250 defines the complex operation path 240 and the location in the 3D complex operation field of the task to be performed. The TCPF 160 defines the required orientation, with a tolerance, in which the EOA 225 must suitably match at a particular task location 250 to complete the task. In order for an EOA 225 to complete a task for the simulation, the simulated robot 210 must extend the EOA 225 so that the SRCP 230 reaches the task location 250 and the SRPF 235 must match within the tolerance of the TCPF 160 for the task location 250.

The simulation program 152 calculates the total energy consumption 265 and total cycle time 270 for robotic movement 275 of the simulated robot 210. The total energy consumption 265 is the amount of energy consumed by the robot determined by the robotic simulation 200. The total cycle time 270 is the amount of time the robot takes to complete a cycle determined by the robotic simulation 200. In this embodiment, the total energy consumption 265 and total cycle time 270 are determined between each task location 250.

Figure 3:
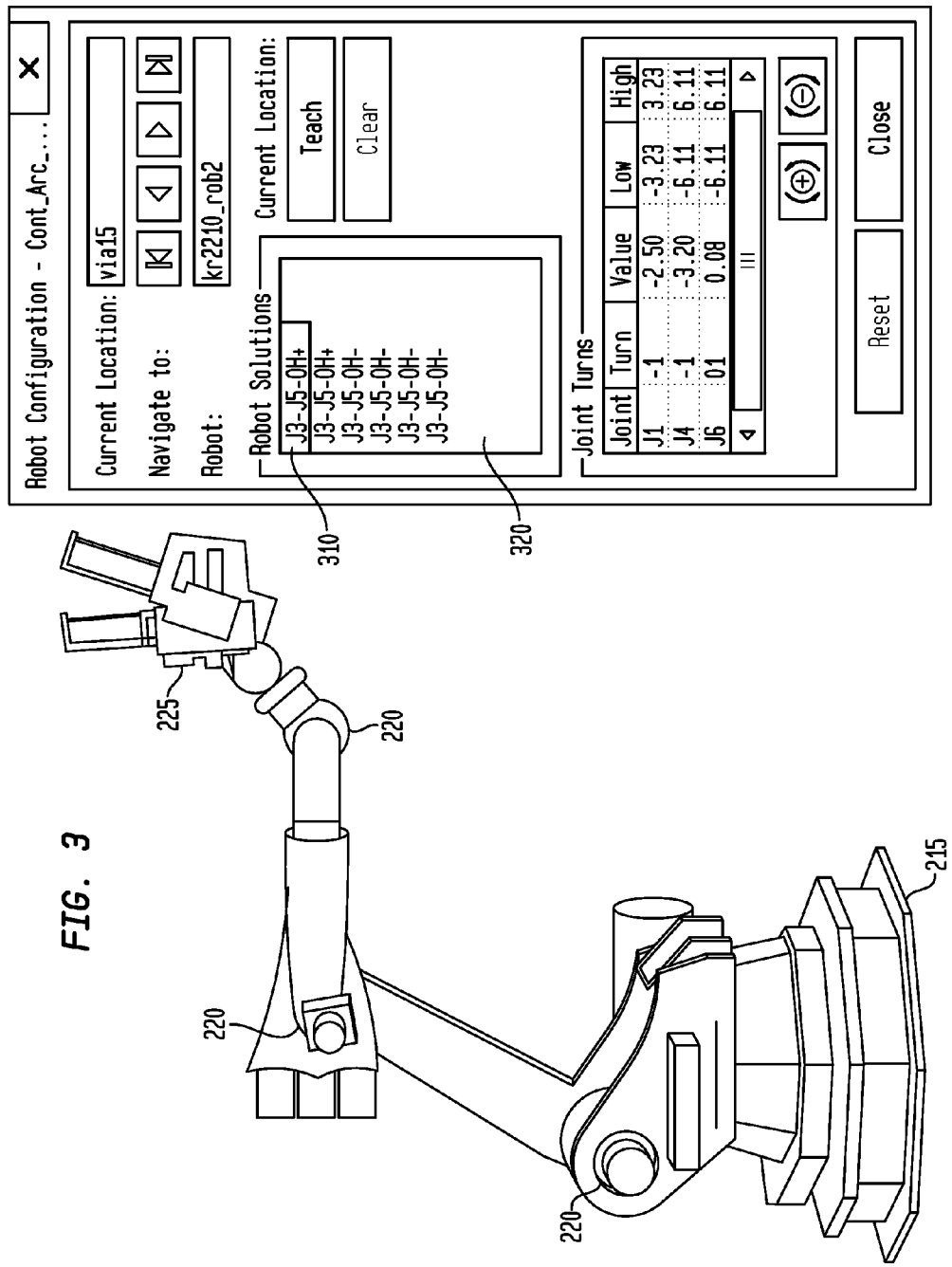
FIG. 3 illustrates a joint configuration for a simulated robot at a specific task location in accordance with the disclosed embodiments.

FIG. 3 illustrates a joint configuration 310 for a simulated robot 210 at a specific task location 250 in accordance with the disclosed embodiments.

In this embodiment, the simulated robot 210 has six different joint configuration 310 solutions to reach the specific task location 250. Each joint configuration 310 will lead to different joint values. Some joints 220 include two designations noted and differentiated in the joint configuration 310 with a positive sign (+) or a negative sign (−). In certain embodiments, the designation is determined to be positive or negative based on a user definition or the robot vendor applied to the model.

In certain embodiments, the number of possible joint configurations 310 is determined based on the possible ways to reach the target location by the simulated robot 210. In some embodiments, the user can select the joint configurations 310 from the list of joint configurations 320. In the illustrated embodiment, the list of joint configurations 320 contains a possible six different joint configurations 310, but more or less configurations are contemplated.

Figure 4A:
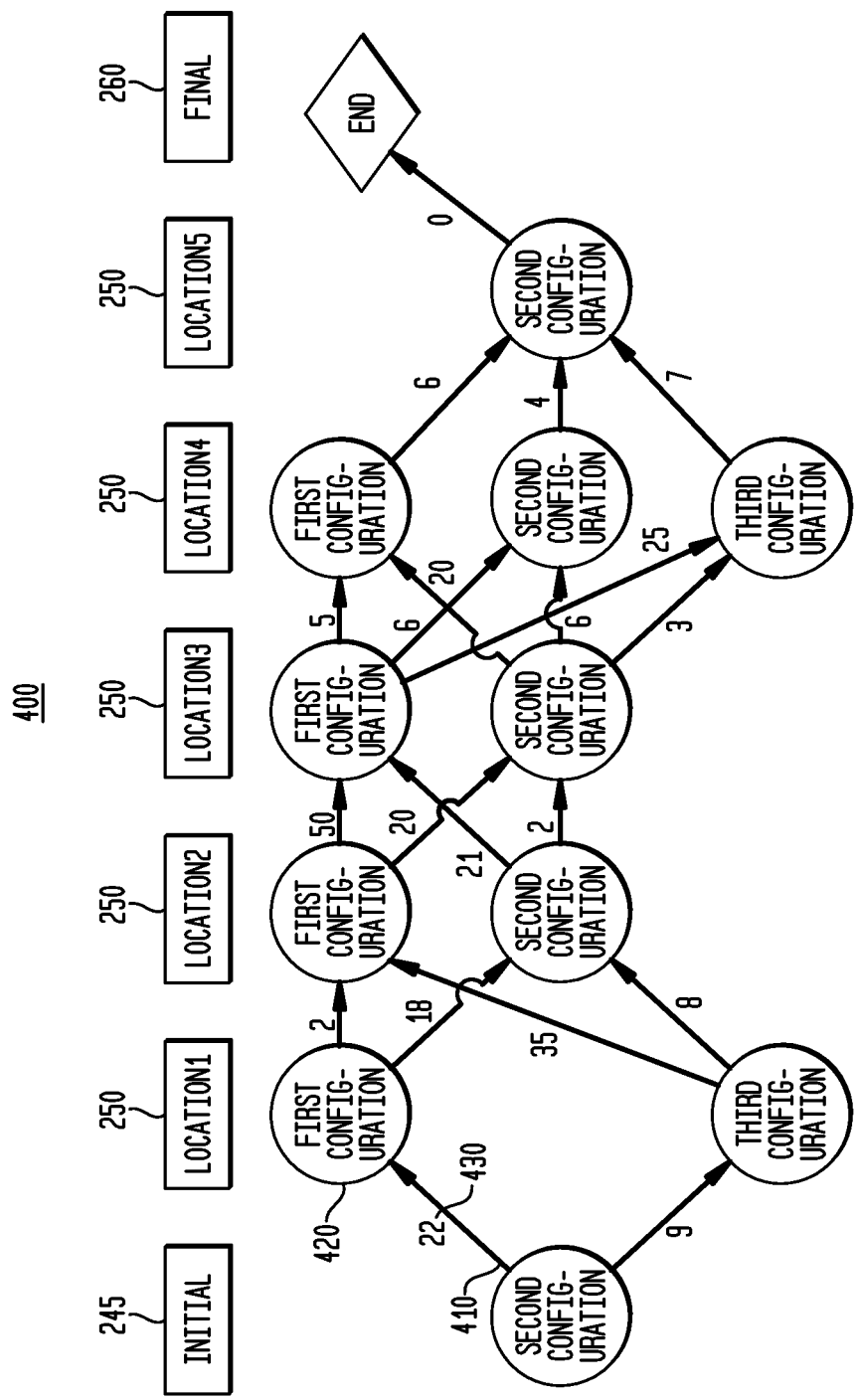
FIG. 4A illustrates a directed acyclic graph (DAG) of different robotic movement edges using combinations of joint configurations at the task locations for completing a complex operation in accordance with the disclosed embodiments.
Figure 4B:
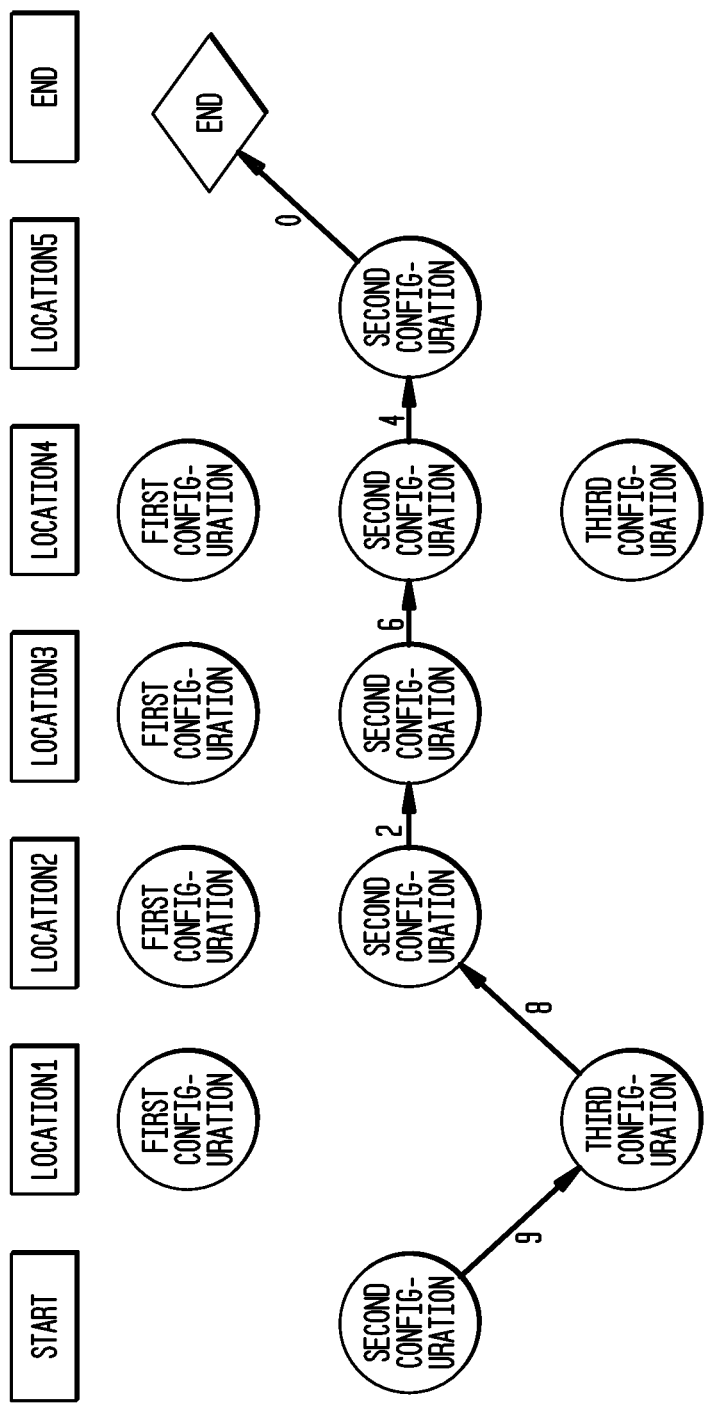
FIG. 4B illustrates the optimal configuration path in accordance with the disclosed embodiments.

FIGS. 4A and 4B illustrate directed acyclic graphs (DAG) 400 of different joint configurations 310 at task locations 250 for a complex operation 158 in accordance with the disclosed embodiments. FIG. 4A illustrates a DAG 400 of different robotic movement edges 410 using combinations of joint configurations 310 at different task locations 250 for completing a complex operation 158 in accordance with the disclosed embodiments. Because the joint configurations 310 are defined by the designations of the joints 220, one joint configuration 310 or a combination of joint configurations 310 can be used to reach all the different task locations 250 for completing the complex operation 158. In this embodiment, three joint configurations 310 are possible in this complex operation 158. The robotic movements 275 are represented in the DAG 400 by robotic movement edges 410. The joint configurations 310 are represented in the DAG 400 by joint configuration vertices 420.

Between every joint configuration vertices 420 of a task location 250 to the next one, all possible robotic movement edges 410 are generated connecting all joint configuration vertices 420 of the current task location 250 to all the joint configuration vertices 420 of the next task location 250. The robotic movement edges' 410 weight values connecting the different joint configuration vertices 420 between task locations 250 illustrate the rating of the simulated robot 210 to move between task locations 250 for the respective joint configurations 310.

In this embodiment, the initial location 245 is the current robot position with the current configuration. The initial location 245 could be the first task location, the final location 260 of the previous process, or any other suitable location. In the illustrated embodiment, the initial location 245 is defined with the second configuration.

If the user defines a locked configuration for a specific location, the process forces to move to this task location 250 keeping the joint configuration vertices 420 of the previous task location 250. Therefore, in this case, the only robotic movement edges 410 that connect the previous and the current task locations 250 with similar joint configuration vertices 420 will be added to the DAG 400.

In this embodiment, the final location 260 is actually not a real task location 250, but a dummy location, so the DAG 400 will be closed and will able to be resolved by DAG algorithms 178. Since it is a dummy location, it has no robotic movement 275 and therefore a '0' rating.

With all the task locations 250 designated, the simulation program 152 calculates total energy consumption 265 and total cycle time 270 as robotic movement edge 410 required for the robotic motion 275 between all task locations 250 for all the possible joint configurations 310 of the complex operation 158.

The total cycle time 270 and the total energy consumption 265 can be calculated from a realistic robot simulation (RRS) for all possible robotic movements 275 between task locations 250. The robot simulation 200 simulates the robot performing the complex operation 158 and the robot simulation 200 provides the total cycle time 270 and the total energy consumption 265 of the robotic movement edge 410.

The system determines the energy consumption weight (EW) 162 and the cycle time weight (TW) 164. Each of the EW 162 and the TW 164 can be constant or based on a combination of values including the total cycle time 270 and the total energy consumption 265 via a formula. In this embodiment, the EW 162 formula defines the weight that the total energy consumption 265 has on the ratings and the TW 164 formula defines the weight that the total cycle time 270 has on the ratings.

The system determines an energy consumption rating (ER) 166 and a cycle time rating (TR) 168 based on the EW 162, the TW 164, the total cycle time 270, and the total energy consumption 265. In certain embodiments, the ER 166 and the TR 168 can be determined via equations (1) and (2), respectively:

$$ER = \frac{f_{EW}}{f_{EW} + f_{TW}} \quad (1)$$

$$TR = \frac{f_{TW}}{f_{EW} + f_{TW}} \quad (2)$$

The system determines a comprehensive edge rating ($r_i$) based on one or more of the ER 166, the TR 168, the EW 162, the TW 164, the total cycle time 270, and the total energy consumption 265. In certain embodiments, the edge rating 430 ($r_i$) is determined via equation (3):

$$r_i = \frac{W_i \cdot ER}{\sum_{k=0}^{n} W_i} + \frac{t_i \cdot TR}{\sum_{k=0}^{n} t_i} \quad (3)$$

where $r_i$ is the normalized edge rating of the robotic movement edge 410 ($i$), $W_i$ is the total energy consumption 265 for the robotic movement edge 410 ($i$), and $t_i$, is total cycle time 270 for the robotic movement edge 410 ($i$).

In some embodiments, the edge ratings 430 for each robotic movement edge 410 for a candidate configuration path 174 are added together to calculate a candidate rating 170 for the total rating of the candidate configuration path 174. The candidate rating 170 with the lowest value is the optimal rating 172, in terms of energy-time correlation, and will be the optimal configuration path 440.

where (n) is the number of robotic movement edges 410 and:

$$R = \sum_{i=0}^{n} r_i = 1 \quad (4)$$

so that the sum of all normalized edge ratings ($r_i$) is equal to 1.

Based on the total energy consumption 265 ($W_i$), the total cycle time 270 ($t_i$), the ER 166, the TR 168, the $r_i$, the DAG algorithm 178 provides the optimal configuration path 440 having the lowest value of all the $r_i$, values.

FIG. 4B illustrates an optimal configuration path 440 in accordance with the disclosed embodiments. For the optimal configuration path 440 of the complex operation 158 in this embodiment, the simulated robot 210 starts in the second configuration and changes to the third configuration at location 1. The simulated robot 210 then changes back to the second configuration at location 2 and remains in the second configuration until the end.

Figure 5:
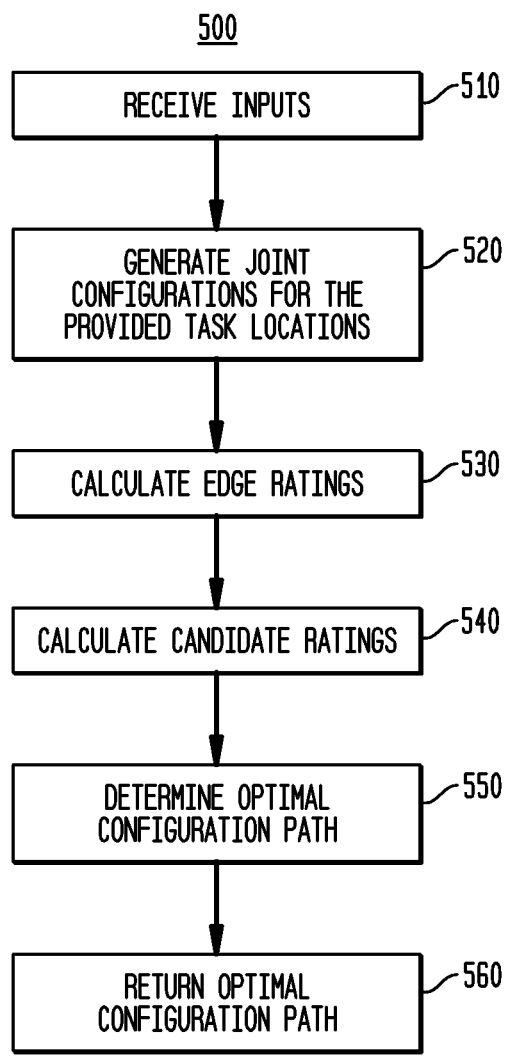
FIG. 5 illustrates a flowchart of a process for saving energy and reducing cycle time by using optimal robotic joint configurations in accordance with disclosed embodiments.

FIG. 5 illustrates a flowchart 500 of a process for saving energy and reducing cycle time by using optimal robotic joint configurations 310 in accordance with disclosed embodiments that may be performed, for example, by a PLM or PDM system. The energy consumption of the robot is realistic and accurate based on a RRS performed by a data processing system, such as the data processing system 100 of FIG. 1. The RRS interface is known to those of skill in the art, and is described at time of filing, for example, at realistic-robot-simulation.org. The system uses RRS simulation to accumulate the energy consumption for each one of the candidate tools and to find the collisions within the robot environment.

In step 510, the system receives inputs including one or more of robot information 154, and position information 156, and the complex operation 158. The robot information 154 can include a model of the robot that allows for simulation of the movements of the robot. The robot information 154 also can include information related to the geometry or environment of the robot, the robot's surroundings, and any objects pertinent to the placement or location of the robot. The complex operation 158 can include information on the complex operation 158 that the robot is to perform, the initial position, a set of task locations 250 for the robot to reach to perform the complex operation 158, TCPF 160, and any other operation related information. The position information 156 contains the robot's position. One or more of the processor 102, the memory 108, and the simulation program 152 running on the processor 102 receive the inputs via one or more of the local system bus 106, the adapter 112, the network 130, the server 140, the interface 114, the I/O bus 116, the disk controller 120, the storage 126, and so on. Receiving, as used herein, can include retrieving from storage 126, receiving from another device or process, receiving via an interaction with a user, or otherwise.

In step 520, the system generates a plurality of joint configurations 310 of a simulated robot 210 for each one of a plurality of task locations 250 for a complex operation 158. The TCPF 160 information, including desired task orientation, the task orientation tolerance, and any other information required for reaching the task location 250, is added to the 3D complex operation field. The system generates a task location 250 in the 3D complex operation field for each of the one or more tasks required for completion of the complex operation 158.

In some embodiments, the system generates a list of candidate configuration paths 176. The list of candidate configuration paths 176 comprises a candidate configuration path 174 for each possible combination of the plurality of joint configurations 310 at each of the task locations 250 for completing the complex operation 158.

When a user designates a task location 250 as a locked configuration location, the systems automatically requires the joint configuration 310 at the task location 250 to match the joint configuration at the previous task location. Once the user designates the locked configuration location at a task location 250, the system skips the generation of a the candidate configuration paths 174 from the list of candidate configuration paths 176 that have different joint configuration 310 at a specific task location 250 matching a previous joint configuration 310 at an immediately preceding task location 250.

While running the simulation for each robotic movement 275, the system also determines if the simulation includes a collision and adjusts the robotic movement 275 to remove one or more collision events. If the system cannot adjust the robotic movement 275 to remove the one or more collision events, the system removes the robotic movement edge 410 from the DAG 400 that contain collision events between the joint configurations 310 of consecutive task location 250. If a collision event is detected for a joint configuration 310 at a task location 250, then the system removes the candidate configuration paths 174 from the list of candidate configuration paths 176 that contain joint configurations 310 at task locations 250 determined to contain a collision event. In certain embodiments, the collision is removed by the system altering the robotic movement 275 between joint configurations 310 of consecutive task locations 250 when a collision event is detected. The robotic movement edge 275 can be altered by adding one or more flyby or additional non-task locations, changing the TCPF 160 of the task location 250, changing the configuration of the robot, and so on. Flyby locations are described, for example, in U.S. Patent Publication 2011/0153080 A1, which is hereby incorporated by reference.

When adding flyby locations, the graph is being changed (a new task location is added—the flyby) and the weights of edges for this specific path should be recalculated. Note that adding a flyby location for a candidate configuration path 174, where a collision is detected, does not necessarily add that flyby location to other candidate configuration paths 174, whether or not a collision is detected. Candidate configuration paths 174 could contain unique flyby locations between task locations 250 when a collision is detected. Different flyby locations can be added for different candidate configuration paths 174 between similar consecutive task locations 250.

In certain embodiments, the system calculates the total energy consumption 265 and the total cycle time 270 for the robotic movements 275 for each of the candidate configuration paths 174. The energy consumption calculation includes the energy the robot consumes to move to the task locations 250 for the complex operation 158. The total energy consumption 265 calculates the amount of energy consumed by the robot in order to complete the complex operation 158 for which the simulation was run. For realistic energy values, the robot simulation 200 can include pauses at task locations 250 to incorporate energy calculations for a task to be completed, such as welding. In certain embodiments, for each candidate configuration path 174 remaining in the list of candidate configuration paths 176, when the total energy consumption 265 does not meet a threshold, the system removes the candidate configuration path 174 from the list of candidate configuration paths 176. The total cycle time 270 is calculated as the time it takes to complete the robotic movement 275 and when the total cycle time 270 does not meet the threshold, the system removes the candidate configuration paths 174 which contain the robotic movement 275 from the list of candidate configuration paths 176.

In step 530, the system calculates the edge ratings 430 for each of a plurality of robotic movements 275. Where a robotic movement 275 accounts for the movement between joint configurations 310 of consecutive task locations 250.

In step 540, the system calculates a plurality of candidate ratings 170 for each of a plurality of candidate configuration paths 174. Where a candidate rating 170 is a summation of edge ratings 430 of robotic movements 275 for a candidate configuration path 174.

In step 550, the system determines the optimal configuration path 440 based on the candidate configuration path 174 with an optimal rating 172. Where the optimal rating 172 is determined based by the lowest candidate rating 170.

In step 560, the system returns the optimal configuration path 440 based on the candidate configuration path 174 with the optimal rating 172 between the total energy consumption 265 and the total cycle time 270. In certain embodiments, the optimal rating 172 is determined as a correlation between the total energy consumption 265 and the cycle time 270 and is determined based on the lowest weight of the candidate configuration paths 174 in the list of candidate configuration paths 176.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke 35 USC §112(f) unless the exact words "means for" are followed by a participle.

What is claimed is:

1. A method for saving energy and reducing cycle time of a complex operation by using optimal robotic joint configurations, the method performed by a data processing system and comprising:
   receiving inputs including the complex operation;
   generating a plurality of joint configurations of a simulated robot for each one of a plurality of task locations based on the inputs of the complex operation;
   calculating an edge rating for each of a plurality of robotic movements edges, wherein a robotic movement edge accounts for a robotic movement between joint configurations of consecutive task locations;
   calculating a plurality of candidate ratings for each of a plurality of candidate configuration paths, wherein a candidate rating is a summation of edge ratings of robotic movement edges for a candidate configuration path;
   determining an optimal configuration path based on the candidate configuration path with an optimal rating, wherein the optimal rating is determined by the lowest candidate rating; and
   returning the optimal configuration path.

2. The method of claim 1, wherein determining the optimal configuration path comprises using a directed acyclic graph algorithm.

3. The method of claim 1, further comprising:
   removing the robotic movement edges that change joint configurations at a locked task location.

4. The method of claim 1, further comprising:
   simulating the plurality of robotic movements to determine a total energy consumption and a total cycle time for each of the plurality of robotic movement edges.

5. The method of claim 4, further comprising:
for each of the plurality of robotic movement edges, determining an energy consumption weight and a cycle time weight based on the total cycle time and the total energy consumption of the robotic movement edge.

6. The method of claim 5, further comprising:
for each of the plurality of robotic movement edges, determining an energy consumption rating and a cycle time rating based on the energy consumption weight, the cycle time weight, the total cycle time, and the total energy consumption of the robotic movement edge.

7. The method of claim 6, further comprising:
for each of the plurality of robotic movement edges, determining a candidate rating based on one or more of the energy consumption rating, the cycle time rating, the energy consumption weight, the cycle time weight, the total cycle time, and total energy consumption of the robotic movement edge.

8. A data processing system comprising:
a processor; and
an accessible memory, the data processing system particularly configured to:
receive inputs including a complex operation;
generate a plurality of joint configurations of a simulated robot for each one of a plurality of task locations based on the inputs of the complex operation;
calculate an edge rating for each of a plurality of robotic movement edges, wherein a robotic movement edge accounts for a robotic movement between joint configurations of consecutive task locations;
calculate a plurality of candidate ratings for each of a plurality of candidate configuration paths, wherein a candidate rating is a summation of edge ratings of robotic movement edges for a candidate configuration path;
determine an optimal configuration path based on the candidate configuration path with an optimal rating, wherein the optimal rating is determined by the lowest candidate rating; and
return the optimal configuration path.

9. The data processing system of claim 8, wherein to determine the optimal configuration path comprises using a directed acyclic graph algorithm.

10. The data processing system of claim 8, further comprising:
remove the robotic movement edges that change joint configurations at a locked task location.

11. The data processing system of claim 8, further comprising:
simulate the plurality of robotic movements to determine a total energy consumption and a total cycle time for each of the plurality of robotic movement edges.

12. The data processing system of claim 11, further comprising:
for each of the plurality of robotic movement edges, determine an energy consumption weight and a cycle time weight based on the total cycle time and the total energy consumption of the robotic movement edge.

13. The data processing system of claim 12, further comprising:
for each of the plurality of robotic movement edges, determine an energy consumption rating and a cycle time rating based on the energy consumption weight, the cycle time weight, the total cycle time, and the total energy consumption of the robotic movement edge.

14. The data processing system of claim 13, further comprising:
for each of the plurality of robotic movement edges, determine a candidate rating based on one or more of the energy consumption rating, the cycle time rating, the energy consumption weight, the cycle time weight, the total cycle time, and total energy consumption of the robotic movement edge.

15. A non-transitory computer-readable medium encoded with executable instructions that, when executed, cause one or more data processing systems to:
receive inputs including a complex operation;
generate a plurality of joint configurations of a simulated robot for each one of a plurality of task locations based on the inputs of the complex operation;
calculate an edge rating for each of a plurality of robotic movement edges, wherein a robotic movement edge accounts for a robotic movement between joint configurations of consecutive task locations in a graph including joint configuration vertices that represent the joint configurations, and wherein the robotic movement edges connect the joint configuration vertices of a first task location the joint configuration vertices of a second task location;
calculate a plurality of candidate ratings for each of a plurality of candidate configuration paths, wherein a candidate rating is a summation of edge ratings of robotic movement edges
for a candidate configuration path;
determine an optimal configuration path based on the candidate configuration path with an optimal rating, wherein the optimal rating is determined by the lowest candidate rating; and
return the optimal configuration path.

16. The computer-readable medium of claim 15, wherein to determine an optimal configuration path comprises using a directed acyclic graph algorithm.

17. The computer-readable medium of claim 15, further comprising:
remove robotic movement edges that change joint configurations at a locked task location.

18. The computer-readable medium of claim 15, further comprising:
simulate the plurality of robotic movements to determine a total energy consumption and a total cycle time for each of the plurality of robotic movement edges.

19. The computer-readable medium of claim 18, further comprising:
for each of the plurality of robotic movement edges, determine an energy consumption weight and a cycle time weight based on the total cycle time and the total energy consumption of the robotic movement edge.

20. The computer-readable medium of claim 19, further comprising:
for each of the plurality of robotic movement edges, determine an energy consumption rating and a cycle time rating based on the energy consumption weight, the cycle time weight, the total cycle time, and the total energy consumption of the robotic movement edge.

* * * * *